United States Patent
Bi et al.

(10) Patent No.: US 10,797,253 B2
(45) Date of Patent: Oct. 6, 2020

(54) FABRICATION METHOD AND FABRICATION ASSEMBLY FOR FLEXIBLE DISPLAY SUBSTRATE

(71) Applicants: BEIJING BOE DISPLAY TECHNOLOGY CO., LTD., Beijing (CN); BOE TECHNOLOGY GROUP CO., LTD., Beijing (CN)

(72) Inventors: Jianqiang Bi, Beijing (CN); Ming Hua, Beijing (CN); Peng Li, Beijing (CN); Yuanfu Bao, Beijing (CN); Jinya Feng, Beijing (CN); Jie Ge, Beijing (CN); Lei Bai, Beijing (CN); Xuemin Liu, Beijing (CN); Zhen Li, Beijing (CN); Haiyan Yang, Beijing (CN); Jianguo Xing, Beijing (CN)

(73) Assignees: BEIJING BOE DISPLAY TECHNOLOGY CO., LTD., Beijing (CN); BOE TECHNOLOGY GROUP CO., LTD., Bejing (CN)

( * ) Notice: Subject to any disclaimer, the term of this patent is extended or adjusted under 35 U.S.C. 154(b) by 0 days.

(21) Appl. No.: 16/431,832

(22) Filed: Jun. 5, 2019

(65) Prior Publication Data
US 2020/0106030 A1   Apr. 2, 2020

(30) Foreign Application Priority Data
Sep. 28, 2018 (CN) .......................... 2018 1 1140640

(51) Int. Cl.
  H01L 51/00   (2006.01)
  H01L 27/32   (2006.01)
  H01L 51/56   (2006.01)

(52) U.S. Cl.
  CPC ...... *H01L 51/0097* (2013.01); *H01L 27/3244* (2013.01); *H01L 51/56* (2013.01); *H01L 2251/5338* (2013.01)

(58) Field of Classification Search
  CPC ................. H01L 51/0097; H01L 51/56; H01L 2251/5338
  See application file for complete search history.

(56) References Cited

U.S. PATENT DOCUMENTS

2013/0328071 A1* 12/2013 Tanaka ................ H01L 27/1259
                                                       257/88
2017/0011945 A1   1/2017 Bedell et al.
(Continued)

FOREIGN PATENT DOCUMENTS

CN    205451694    8/2016
CN    106935547    7/2017
(Continued)

OTHER PUBLICATIONS

Chinese Office Action dated Apr. 20, 2020 corresponding to Chinese Patent Application No. 201811140640.7; 15 pages.

*Primary Examiner* — Changhyun Yi
(74) *Attorney, Agent, or Firm* — Leason Ellis LLP

(57) ABSTRACT

A fabrication method and a fabrication assembly for a flexible display substrate are provided. The fabrication assembly for a flexible display substrate includes: a rigid base substrate, including a first engaging structure being on a surface of the rigid base substrate; and a protective film, including a first surface and a second surface opposite to each other, and including a second engaging structure being on the first surface. The second surface of the protective film is configured to be attached to a flexible base substrate; and the rigid base substrate and the protective film are config-
(Continued)

ured to be detachably connected with each other by the first engaging structure and the second engaging structure.

18 Claims, 7 Drawing Sheets

(56) References Cited

U.S. PATENT DOCUMENTS

| | | | |
|---|---|---|---|
| 2018/0047921 A1 | 2/2018 | Seo et al. | |
| 2018/0130970 A1* | 5/2018 | Wang | G02F 1/13394 |
| 2019/0334103 A1 | 10/2019 | Liu et al. | |

FOREIGN PATENT DOCUMENTS

| | | |
|---|---|---|
| CN | 108447816 | 8/2018 |
| CN | 108550587 | 9/2018 |

* cited by examiner

FABRICATION METHOD AND FABRICATION ASSEMBLY FOR FLEXIBLE DISPLAY SUBSTRATE

CROSS-REFERENCE OF RELATED APPLICATION

The present application claims priority of Chinese patent application No. 201811140640.7, filed on Sep. 28, 2018, the disclosure of which is incorporated herein by reference as part of the application.

TECHNICAL FIELD

Embodiments of the present disclosure relate to a fabrication method and a fabrication assembly for a flexible display substrate.

BACKGROUND

A flexible display substrate comprises a flexible base substrate and a flexible light emitting device provided on the flexible base substrate. The flexible base substrate is usually prepared from a flexible base material having a thickness of less than 100 microns. Because the flexible base substrate has problems of fragility, deformation and so on, in a fabrication process of the flexible display substrate, the flexible base substrate is usually bonded to a rigid base substrate, and then the flexible light emitting device is prepared on the flexible base substrate. After the flexible light emitting device is prepared on the flexible base substrate, the rigid base substrate is stripped off to obtain the flexible display substrate.

SUMMARY

Embodiments of the present disclosure provide a fabrication method and a fabrication assembly for a flexible display substrate.

At least an embodiment of the present disclosure provides a fabrication assembly for a flexible display substrate, the assembly comprises: a rigid base substrate, comprising a first engaging structure being provided on a surface of the rigid base substrate; and a protective film, comprising a first surface and a second surface opposite to each other, and comprising a second engaging structure being provided on the first surface. The second surface of the protective film is configured to be attached to a flexible base substrate; and the rigid base substrate and the protective film are configured to be detachably connected with each other by the first engaging structure and the second engaging structure.

In the assembly provided by at least an embodiment of the present disclosure, the first engaging structure and the second engaging structure are both tenon-mortise structures.

In the assembly provided by at least an embodiment of the present disclosure, the first engaging structure comprises a plurality of first bar-shaped tenons and a plurality of first bar-shaped mortises, and the second engaging structure comprises a plurality of second bar-shaped tenons and a plurality of second bar-shaped mortises; one of the plurality of first bar-shaped mortises is provided between two adjacent first bar-shaped tenons, and one of the plurality of second bar-shaped mortises is provided between two adjacent second bar-shaped tenons; and structures of the plurality of first bar-shaped tenons respectively match structures of the plurality of second bar-shaped mortises, and structures of the plurality of second bar-shaped tenons respectively match structures of the plurality of first bar-shaped mortises.

The assembly provided by at least an embodiment of the present disclosure further comprises two baffles respectively provided at both ends of at least one first bar-shaped mortise, wherein a height of each of the two baffles is not greater than a height of at least one first bar-shaped tenon.

In the assembly provided by at least an embodiment of the present disclosure, the first bar-shaped tenon comprises a through hole extending in a direction perpendicular to an extension direction of the first bar-shaped tenon, and the baffles are configured to pass through the through hole.

In the assembly provided by at least an embodiment of the present disclosure, the first bar-shaped tenons comprise a plurality of through holes sequentially arranged along the extension direction of the first bar-shaped tenons.

In the assembly provided by at least an embodiment of the present disclosure, the second engaging structure satisfies at least one of conditions below: a surface of each of the plurality of second bar-shaped tenons is provided with a magnetic material; and an inner wall of each of the plurality of second bar-shaped mortises is provided with a magnetic material.

In the assembly provided by at least an embodiment of the present disclosure, a size of each of the plurality of first bar-shaped tenons is equal to a size of each of the plurality of second bar-shaped tenons; and a size of each of the plurality of second bar-shaped tenons is equal to a size of each of the plurality of first bar-shaped mortises.

In the assembly provided by at least an embodiment of the present disclosure, a shape of a longitudinal cross-section of at least one of the first bar-shaped tenons or at least one of the second bar-shaped tenons comprises at least one of a rectangular shape, a triangular shape and a trapezoidal shape.

At least an embodiment of the present disclosure provides a fabrication method of a flexible display substrate, comprising: providing a rigid base substrate, a flexible base substrate and a protective film; wherein a first engaging structure is provided on a surface of the rigid base substrate, the protective film comprises a first surface and a second surface opposite to each other, and a second engaging structure is provided on the first surface; attaching the second surface of the protective film to the flexible base substrate, so as to allow the protective film and the flexible base substrate to be fixed; snap-fitting the first engaging structure and the second engaging structure, so as to allow the protective film to be fixed on the rigid base substrate; preparing a light emitting device on a surface of the flexible base substrate that is away from the rigid base substrate; and separating the flexible base substrate from the second surface of the protective film, to obtain the flexible display substrate.

In the method provided by at least an embodiment of the present disclosure, the attaching the second surface of the protective film to the flexible base substrate comprises: attaching the second surface of the protective film to the flexible base substrate by means of electrostatic adsorption or residue-free glue.

In the method provided by at least an embodiment of the present disclosure, the first engaging structure and the second engaging structure are both tenon-mortise structures; and the snap-fitting the first engaging structure and the second engaging structure, so as to allow the protective film to be fixed on the rigid base substrate, comprises: fixing the protective film on the rigid base substrate by means of a tenon-mortise connection.

In the method provided by at least an embodiment of the present disclosure, the protective film and the rigid base substrate are fixed in a first direction by the first engaging structure and the second engaging structure; the first engaging structure comprises a plurality of first bar-shaped tenons and a plurality of first bar-shaped mortises, and the second engaging structure comprises a plurality of second bar-shaped tenons and a plurality of second bar-shaped mortises; one of the plurality of first bar-shaped mortises is provided between two adjacent first bar-shaped tenons, and one of the plurality of second bar-shaped mortises is provided between two adjacent second bar-shaped tenons; and structures of the plurality of first bar-shaped tenons respectively match structures of the plurality of second bar-shaped mortises, and structures of the plurality of second bar-shaped tenons respectively match structures of the plurality of first bar-shaped mortises.

In the method provided by at least an embodiment of the present disclosure, a size of each of the first bar-shaped tenons is equal to a size of each of the second bar-shaped mortises; and a size of each of the second bar-shaped tenons is equal to a size of each of the first bar-shaped mortises.

In the method provided by at least an embodiment of the present disclosure, the second engaging structure satisfies at least one of conditions below: a surface of at least one second bar-shaped tenon is provided with a magnetic material; and an inner wall of at least one second bar-shaped mortise is provided with a magnetic material. The protective film and the rigid base substrate are configured to be fixed in a second direction, and the second direction is perpendicular to the first direction.

In the method provided by at least an embodiment of the present disclosure, a shape of a longitudinal cross-section of at least one of the first bar-shaped tenons or at least one of the second bar-shaped tenons comprises a trapezoidal shape, so as to allow the protective film and the rigid base substrate to be fixed in the second direction.

In the method provided by at least an embodiment of the present disclosure, two baffles are respectively provided at both ends of at least one first bar-shaped mortise, so as to allow the protective film and the rigid base substrate to be fixed in a third direction; a height of each of the baffles is not greater than a height of the first bar-shaped tenon; and the third direction is perpendicular to a plane in which the first direction and the second direction are located.

In the method provided by at least an embodiment of the present disclosure, the first bar-shaped tenon comprises a through hole provided in a direction perpendicular to an extension direction of the first bar-shaped tenon, and the baffles are provided to pass through the through hole, so as to allow the protective film and the rigid base substrate to be fixed in the third direction.

In the method provided by at least an embodiment of the present disclosure, the flexible base substrate is separated from the second surface of the protective film by means of hand tearing or a film tearing machine.

In the method provided by at least an embodiment of the present disclosure, the providing the protective film comprises: providing a film base material; and forming the second engaging structure on a first surface of the film base material by a patterning process; alternatively, the providing the protective film comprises: providing a film base material; preparing the second engaging structure; and fixing the second engaging structure on the first surface of the film base material by a bonding agent.

DETAILED DESCRIPTION

In order to make objects, technical solutions and advantages of the embodiments of the present disclosure apparent, the embodiments of the disclosure will be further described in detail in connection with the drawings.

In a related art, a bonding layer is usually provided between a flexible base substrate and a rigid base substrate, so that the flexible base substrate and the rigid base substrate are fixedly bonded together by the bonding layer. After preparation of a light emitting device is completed, the rigid base substrate is heated to disable a viscous material on a surface of the bonding layer, so that a display substrate is stripped off from the rigid base substrate.

However, in a process of heating the rigid base substrate, a flexible light emitting device is easily damaged, rendering a relatively low fabrication reliability of a flexible display substrate in the related art.

Figure 1:
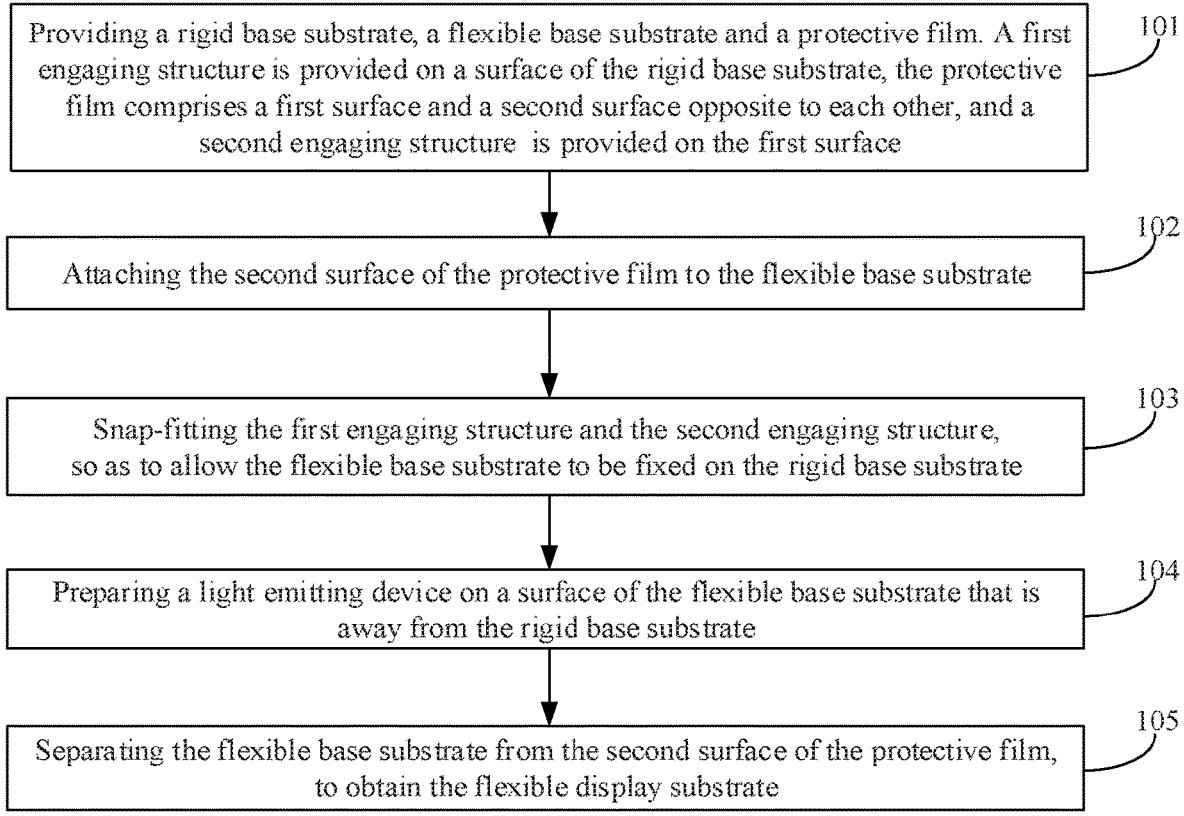
FIG. 1 is a flow chart of a fabrication method of a flexible display substrate provided by an embodiment of the present disclosure.

FIG. 1 is a flow chart of a fabrication method of a flexible display substrate provided by an embodiment of the present disclosure. As shown in FIG. 1, the method comprises the following steps.

Step 101: providing a rigid base substrate, a flexible base substrate and a protective film. A first engaging structure is provided on a surface of the rigid base substrate. The protective film comprises a first surface and a second surface that are opposite to each other, and a second engaging structure is provided on the first surface.

Step 102: attaching the second surface of the protective film to the flexible base substrate in a non-adhesive manner.

Step 103: snap-fitting the first engaging structure and the second engaging structure, so as to allow the flexible base substrate to be fixed on the rigid base substrate.

Step 104: preparing a light emitting device on a surface of the flexible base substrate that is away from the rigid base substrate. The light emitting device comprises, for example, a flexible light emitting device.

Step 105: separating the flexible base substrate from the second surface of the protective film, to obtain the flexible display substrate.

In the fabrication method of the flexible display substrate provided by the embodiment of the present disclosure, the protective film provided with the second engaging structure is attached to the flexible base substrate; the flexible base substrate is fixed on the rigid base substrate by a snap-fitting between the first engaging structure provided on the rigid base substrate and the second engaging structure on the protective film; further, the flexible light emitting device is prepared on the surface of the flexible base substrate that is away from the rigid base substrate; and after the flexible light emitting device is prepared, the flexible base substrate is separated from the protective film, to obtain the flexible display substrate.

Of course, in other embodiments, a second surface of a protective film may also be attached to a flexible base substrate in other manners, for example, the second surface of the protective film may be attached to the flexible base substrate by residue-free glue. For example, the residue-free glue may be ordinary residue-free glue. In the embodiment of the present disclosure, because the protective film is provided between the flexible base substrate and the rigid base substrate, the protective film can function to protect the flexible base substrate; where the protective film and the flexible base substrate are being fixed together, the residue-free glue can be used without any bonding layer, so that it is not necessary to separate the protective film from the flexible base substrate by heating. For example, after the fabrication of a display substrate is completed and the protective film is separated from the rigid base substrate, the protective film may be separated from the flexible base substrate by means of hand tearing or a film tearing machine.

In the embodiment of the present disclosure, because the flexible base substrate and the protective film are bonded together in a non-adhesive manner or by means of residue-free glue, it is not necessary to heat in the process of separating the flexible base substrate from the protective film, which can avoid damage to the flexible light emitting device, and further improve fabrication reliability of the flexible display substrate.

Figure 2:
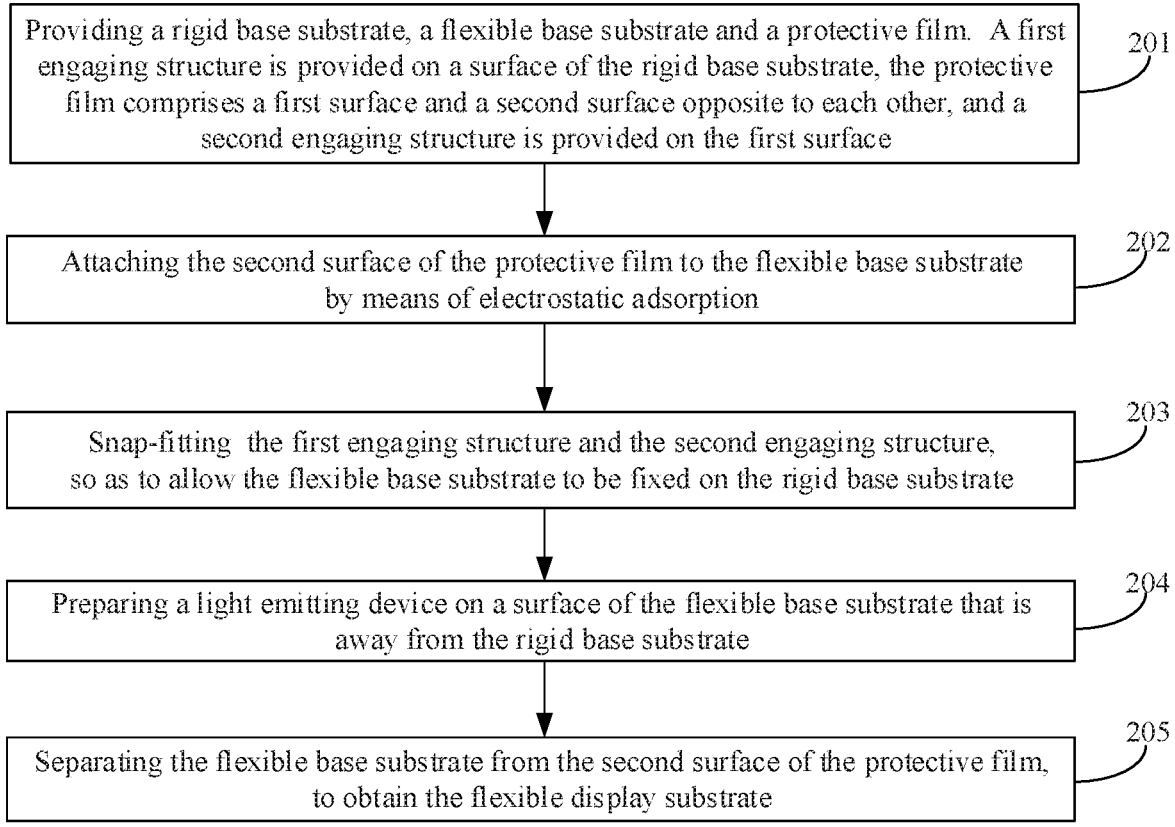
FIG. 2 is a flow chart of another fabrication method of a flexible display substrate provided by an embodiment of the present disclosure.

FIG. 2 is a flow chart of another fabrication method of a flexible display substrate provided by an embodiment of the present disclosure. As shown in FIG. 2, the method comprises the following steps.

Step 201: providing a rigid base substrate, a flexible base substrate and a protective film. A first engaging structure is provided on a surface of the rigid base substrate. The protective film comprises a first surface and a second surface opposite to each other, and a second engaging structure is provided on the first surface.

For example, the rigid base substrate may be prepared from a metal material, glass or a polyvinyl chloride material. The flexible base substrate may be prepared from an organic material such as a polycarbonate (PC) material, a polyimide (PI) material, or a polyethylene terephthalate (PET) material, or may also be prepared from a metal material. The protective film may be prepared from a PET material, a PI material, or tempered glass. The materials of the rigid base substrate, the flexible base substrate and the protective film are not limited in the embodiment of the present disclosure. For example, hardness of the protective film is greater than hardness of the flexible base substrate and less than hardness of the rigid base substrate.

For example, the first engaging structure and the second engaging structure are both tenon-mortise structures.

Figure 3:
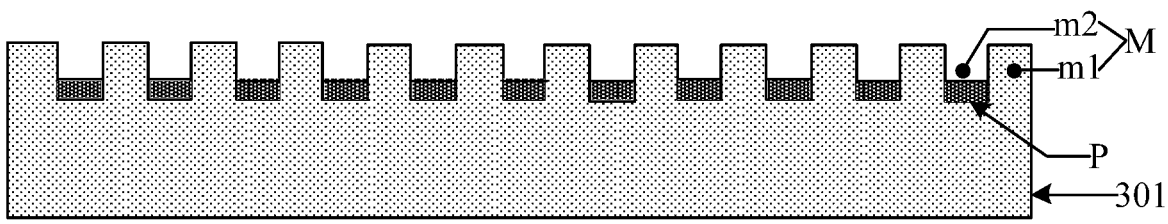
FIG. 3 is a structural schematic diagram of a rigid base substrate provided by an embodiment of the present disclosure.

FIG. 3 is a structural schematic diagram of a rigid base substrate provided by an embodiment of the present disclosure. As shown in FIG. 3, a first engaging structure M is provided on a surface of a rigid base substrate 301, and the first engaging structure M comprises a plurality of first bar-shaped tenons m1 and a plurality of first bar-shaped mortises m2.

Figure 4:
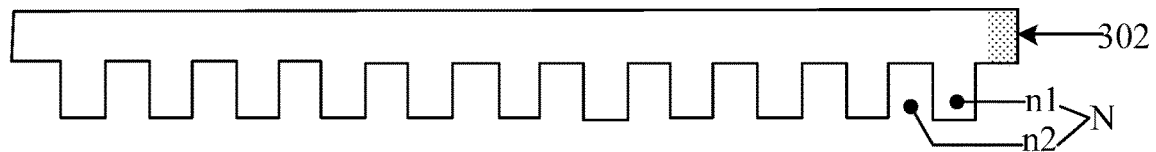
FIG. 4 is a structural schematic diagram of a protective film provided by an embodiment of the present disclosure.

FIG. 4 is a structural schematic diagram of a protective film provided by an embodiment of the present disclosure. As shown in FIG. 4, a second engaging structure N is provided on the protective film 302, and the second engaging structure N comprises a plurality of second bar-shaped tenons n1 and a plurality of second bar-shaped mortises n2.

With reference to FIG. 3 and FIG. 4, a structure of a first bar-shaped tenon m1 matches a structure of a second bar-shaped mortise n2, and a structure of a second bar-shaped tenon n1 matches a structure of a first bar-shaped mortise m2. For example, a structure of a first bar-shaped tenon matches a structure of a second bar-shaped mortise, that is, a shape and a size of the first bar-shaped tenon both match a shape and a size of the second bar-shaped mortise; and a structure of a second bar-shaped tenon matches a structure of a first bar-shaped mortise, that is, a shape and a size of the second bar-shaped tenon both match a shape and a size of the first bar-shaped mortise.

For example, the size of the first bar-shaped tenon is equal to the size of the second bar-shaped mortise; and the size of the second bar-shaped tenon is equal to the size of the first bar-shaped mortise.

For example, longitudinal cross-sections of the first bar-shaped tenon and the second bar-shaped mortise are in rectangular shapes, and longitudinal cross-sections of the first bar-shaped mortise and the second bar-shaped tenon are in rectangular shapes; alternatively, the longitudinal cross-sections of the first bar-shaped tenon and the second bar-shaped mortise are in triangular shapes, and the longitudinal cross-sections of the first bar-shaped mortise and the second bar-shaped tenon are in triangular shapes; alternatively, the longitudinal cross-sections of the first bar-shaped tenon and the second bar-shaped mortise are in trapezoidal shapes, and the longitudinal cross-sections of the first bar-shaped mortise and the second bar-shaped tenon are in trapezoidal shapes; alternatively, the longitudinal cross-sections of the first bar-shaped tenon and the second bar-shaped mortise are in triangular shapes, and the longitudinal cross-sections of the first bar-shaped mortise and the second bar-shaped tenon are in trapezoidal shapes; alternatively, the longitudinal cross-sections of the first bar-shaped tenon and the second bar-shaped mortise are in trapezoidal shapes, and the longitudinal cross-sections of the first bar-shaped mortise and the second bar-shaped tenon are in triangular shapes; which are not limited in the embodiment of the present disclosure. For example, with reference to FIG. 3 and FIG. 4, longitudinal cross-sections of the first bar-shaped tenon m1 and the second bar-shaped mortise n2 are in rectangular shapes, and longitudinal cross-sections of the first bar-shaped mortise m2 and the second bar-shaped tenon n1 are in rectangular shapes. For example, the longitudinal cross-sections of the first bar-shaped mortise and the second bar-shaped tenon are perpendicular to an arrangement direction of the plurality of first bar-shaped mortises and/or the plurality of first bar-shaped tenons; and the longitudinal cross-sections of the second bar-shaped mortise and the second bar-shaped tenon are perpendicular to an arrangement direction of the plurality of second bar-shaped mortises and/or the plurality of second bar-shaped tenons.

It should be noted that, the size of the first bar-shaped tenon is equal to the size of the second bar-shaped mortise, and the size of the second bar-shaped tenon is equal to the size of the first bar-shaped mortise, that is, where the longitudinal cross-sections of the tenon and the mortise are in rectangular shapes, the rectangular shapes have respective long sides and short sides correspondingly equal in length; where the longitudinal cross-sections of the tenon and the mortise are in triangular shapes, the triangular shapes have respective sides correspondingly equal in length; and where the longitudinal cross-sections of the tenon and the mortise are in trapezoidal shapes, the trapezoidal shapes have respective sides correspondingly equal in length.

Figure 5:
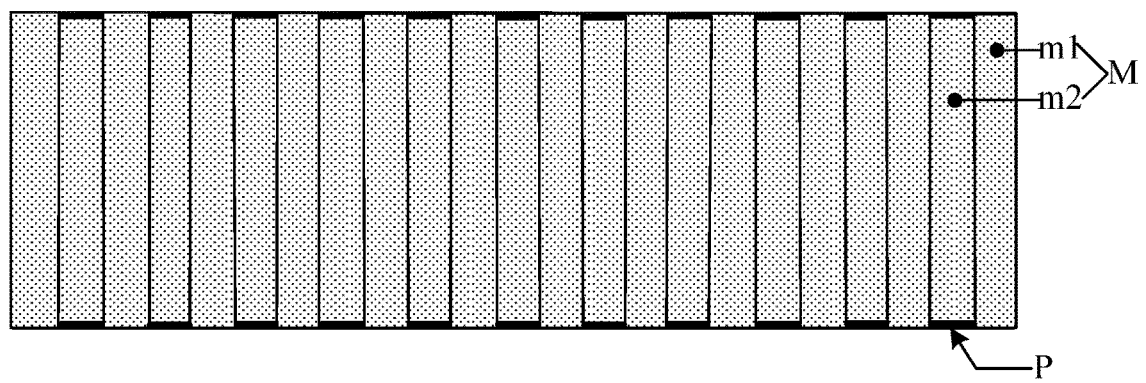
FIG. 5 is a structural top view of the rigid base substrate shown in FIG. 3.

Exemplarily, FIG. 5 is a structural top view of the rigid base substrate shown in FIG. 3. As shown in FIG. 5, the first engaging structure M comprises the plurality of first bar-shaped tenons m1 and the plurality of first bar-shaped mortises m2. For example, in the embodiment of the present disclosure, the plurality of first bar-shaped tenons m1 are arranged in parallel, and the plurality of first bar-shaped mortises m2 are arranged in parallel.

For example, with reference to FIG. 3 and FIG. 5, each of two ends of the first bar-shaped mortise m2 is provided with a baffle P, and a height of the baffle P is not greater than a height of a first bar-shaped tenon m1.

Figure 6:
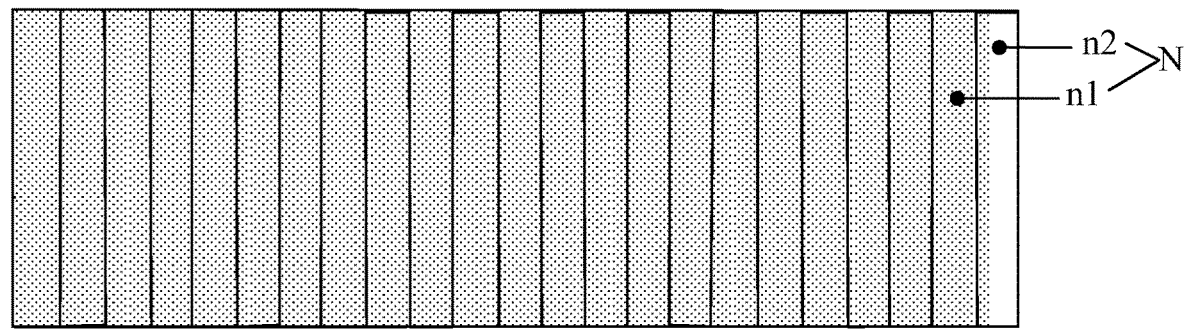
FIG. 6 is a structural bottom view of the protective film shown in FIG. 4.

Each of two ends of the first bar-shaped mortise m2 is provided with a baffle P. FIG. 6 is a structural bottom view of the protective film shown in FIG. 4. As shown in FIG. 6, the second engaging structure N comprises the plurality of second bar-shaped tenons n1 and the plurality of second bar-shaped mortises n2. For example, as shown in FIG. 6, the plurality of second bar-shaped tenons n1 are arranged in parallel, and the plurality of second bar-shaped mortises n2 are arranged in parallel.

For example, the second engaging structure satisfies at least one of conditions below: a surface of the second bar-shaped tenon is provided with a magnetic material; and an inner wall of the second bar-shaped mortise is provided with a magnetic material.

In an embodiment of the present disclosure, a second engaging structure and a protective film may have an integral structure; and accordingly, a preparation process of the protective film comprises: providing a film base material; and forming the second engaging structure on a first surface of the film base material by a patterning process. For example, the patterning process comprises: photoresist coating, exposure, development, etching, and photoresist stripping.

For example, because the second engaging structure and the protective film have an integral structure, the second engaging structure and the protective film are prepared from a same material. Where a preparation material of the protective film is a PET material or a PI material, the protective film may be prepared by a patterning process, alternatively, the protective film may also be prepared by means of injection molding and imprinting; and the preparation process of the protective film is not limited in the embodiment of the present disclosure.

In another embodiment of the present disclosure, a second engaging structure and a film base material may be respectively prepared, and correspondingly, the second engaging structure and the film base material respectively prepared may be fixedly bonded together, to obtain a protective film. For example, a plurality of second engaging structures may be attached to a first surface of the film base material by a bonding agent.

For example, a preparation material of the second engaging structure may be the same as a preparation material of the protective film, or may also be different from the preparation material of the protective film. The preparation material of the second engaging structure may be a PET material or a PI material, or may also be a metal. Where the preparation material of the second engaging structure is a PET material or a PI material, the second engaging structure may be prepared by means of injection molding and imprinting. Where the preparation material of the second engaging structure is a metal, the second engaging structure may be prepared by means of casting; and the preparation material and the preparation process of the second engaging structure are not limited in the embodiment of the present disclosure.

Step 202: attaching the second surface of the protective film to the flexible base substrate by means of electrostatic adsorption.

Figure 7:
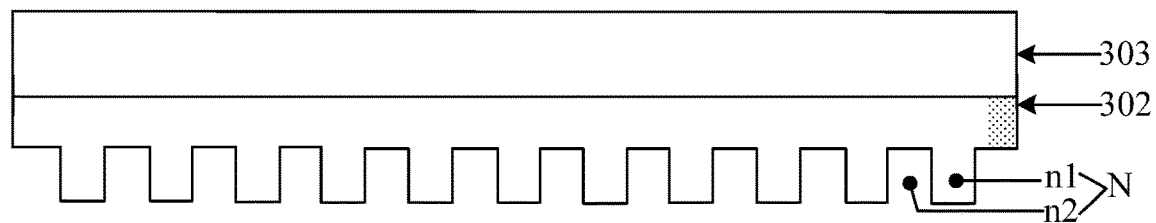
FIG. 7 is a structural schematic diagram of a flexible base substrate attached with a protective film provided by an embodiment of the present disclosure.

FIG. 7 is a structural schematic diagram of a flexible base substrate attached with a protective film provided by an embodiment of the present disclosure. As shown in FIG. 7, the flexible base substrate 303 is bonded to the second surface of the protective film 302.

It should be noted that, electrostatic adsorption is based on a principle of physics; where the protective film is brought into contact with the flexible base substrate, air pressure between the protective film and the flexible base substrate decreases, so that atmospheric pressure is stronger than the air pressure between the protective film and the flexible base substrate, thus generating an adsorption capacity, so that the second surface of the protective film can be attached to the flexible base substrate.

For example, a silica gel layer may be provided on the second surface of the protective film. Where the second surface of the protective film is bonded to the flexible base substrate, an electrostatic adsorption force of the silica gel layer is stronger, so the silica gel layer can be fixedly bonded to the flexible base substrate by means of electrostatic adsorption during a process of attaching the protective film to the flexible base substrate.

For example, the process of attaching the protective film to the flexible base substrate comprises: performing uniform brush on the second surface of the protective film by an electrostatic brush to generate static electricity; then bringing one end of the flexible base substrate close to the second surface of the protective film; and flatly attaching the flexible base substrate to the second surface of the protective film by means of electrostatic adsorption.

For example, the second surface of the protective film may also be attached to the flexible base substrate by means of magnetic adsorption. For example, a magnetic material may be coated at an edge position of the flexible base substrate to form a magnetic thin film, another magnetic material may be coated on the second surface of the protective film, and the magnetic material coated on the second surface of the protective film has a magnetic property opposite to that of the magnetic material coated on the flexible base substrate, and the flexible base substrate is attached to the second surface of the protective film by means of magnetic adsorption of the two types of magnetic materials.

Step 203: snap-fitting the first engaging structure and the second engaging structure, so as to allow the flexible base substrate to be fixed on the rigid base substrate.

For example, where the first engaging structure and the second engaging structure are both tenon-mortise structures, the flexible base substrate attached with the protective film can be fixed on the rigid base substrate by means of a tenon-mortise connection.

Figure 8:
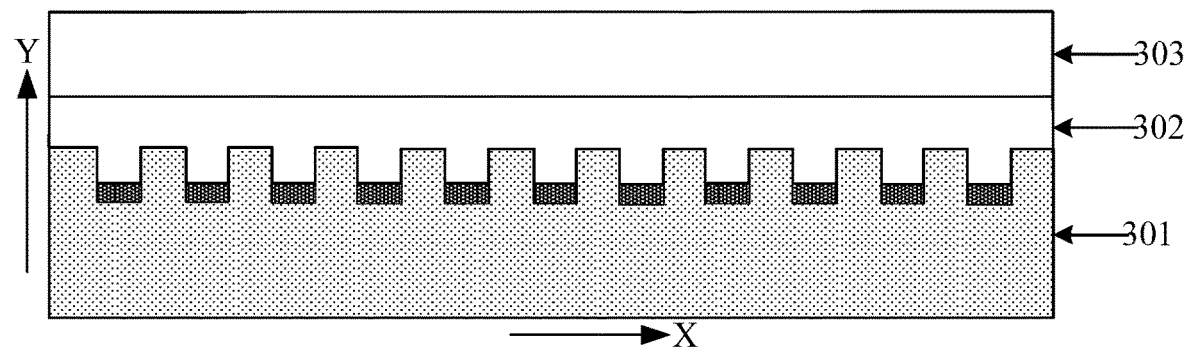
FIG. 8 is a structural schematic diagram showing that the flexible base substrate attached with the protective film shown in FIG. 7 is fixed on the rigid base substrate shown in FIG. 3 provided by an embodiment of the present disclosure.

FIG. 8 is a structural schematic diagram showing that the flexible base substrate attached with the protective film shown in FIG. 7 is connected with the rigid base substrate shown in FIG. 3. As shown in FIG. 8, the flexible base substrate 303 attached with the protective film 302 is fixed on the rigid base substrate 301 by means of a tenon-mortise connection, that is, the first bar-shaped tenon is arranged in the second bar-shaped mortise and the second bar-shaped tenon is arranged in the first bar-shaped mortise, such that the flexible base substrate is fixed on the rigid base substrate through the protective film. FIG. 3 and FIG. 7 may be referred to for other reference signs in FIG. 8, which is not repeated here.

It should be noted that, the rigid base substrate is bonded to the flexible base substrate through the protective film, on the one hand, the first bar-shaped tenon on the rigid base substrate can function for supporting and carrying the flexible display substrate; on the other hand, with reference to FIG. 8, the rigid base substrate 301 can function to limit a position of the flexible base substrate 303 in a first direction X, to avoid displacement between the flexible base substrate and the rigid base substrate in the first direction during the preparation process of the flexible light emitting device, so as to improve preparation reliability of the flexible light emitting device.

For example, the surface of the second bar-shaped tenon is provided with a magnetic material, which may be that the magnetic material is provided on a surface of the second bar-shaped tenon that is in contact with the first bar-shaped mortise. The inner wall of the second bar-shaped mortise is provided with a magnetic material, which may be that the magnetic material is provided on a surface of the second bar-shaped mortise that is in contact with the first bar-shaped tenon. By providing the magnetic material on the surface of the second bar-shaped tenon and/or on the inner wall of the second bar-shaped mortise, with reference to FIG. 8, the rigid base substrate 301 can function to limit a position of the flexible base substrate 303 in a second direction Y, to avoid displacement between the flexible base substrate and the rigid base substrate in the second direction during the preparation process of the flexible light emitting device, so as to improve preparation reliability of the flexible light emitting device.

For example, by providing baffles at both ends of the first bar-shaped mortise, the rigid base substrate can function to limit a position of the flexible base substrate in a third direction, to avoid displacement between the flexible base substrate and the rigid base substrate in the third direction during the preparation process of the flexible light emitting device, so as to improve preparation reliability of the flexible light emitting device. The third direction is perpendicular to the first direction and also perpendicular to the second direction.

For example, where the rigid base substrate is prepared from a metal material, a magnetic material may be provided on the surface of the second bar-shaped tenon of the second engaging structure and/or a magnetic material may be provided on the inner wall of the second bar-shaped mortise of the second engaging structure, and the protective film and the rigid base substrate may be fixedly bonded together by means of magnetic adsorption of the magnetic material. Where the rigid base substrate is prepared from glass or a polyvinyl chloride material, a first magnetic material may be provided on the surface of the second bar-shaped tenon of the second engaging structure and/or a first magnetic material may be provided on the inner wall of the second bar-shaped mortise of the second engaging structure, and a second magnetic material may be provided on the surface of the first bar-shaped mortise of the first engaging structure and/or a second magnetic material may be provided on the inner wall of the first bar-shaped mortise of the first engaging structure. For example, magnetic properties of the first magnetic material and the second magnetic material are opposite to each other, and magnetic adsorption between the first magnetic material and the second magnetic material can allow the protective film to be fixedly bonded to the rigid base substrate.

Step 204: preparing the flexible light emitting device on a surface of the flexible base substrate that is away from the rigid base substrate.

For example, the flexible light emitting device comprises a thin film transistor (TFT) array, a first electrode, a light-emitting layer and a second electrode, which are sequentially provided on the flexible base substrate. For example, the light-emitting layer comprises a first charge carrier injection layer, a first charge carrier transport layer, a light-emitting material layer, a second charge carrier transport layer and a second charge carrier injection layer. Where the first electrode is an anode and the second electrode is a cathode, the first charge carrier is a hole and the second carrier is an electron; alternatively, where the first electrode is a cathode and the second electrode is an anode, the first charge carrier is an electron and the second charge carrier is a hole.

For example, the TFT may comprise a gate metal pattern, a gate insulating layer, an active layer, a source-drain metal pattern and a passivation layer, which are sequentially formed on the base substrate.

For example, the gate metal pattern may be prepared from metal molybdenum (Mo): a metal molybdenum layer may be formed by means of deposition, and then the gate metal pattern is formed by a patterning process. The gate insulating layer may be prepared from silicon dioxide ($SiO_2$): a silicon dioxide film layer may be formed on the base substrate on which the gate metal pattern is formed by means of deposition, and then the gate insulating layer is formed by a patterning process. The active layer may be prepared from indium gallium zinc oxide (IGZO): an indium gallium zinc oxide layer may be formed on the base substrate on which the gate insulating layer is formed by means of deposition, and then the active layer is formed by a patterning process.

The source-drain metal pattern may be prepared from metal molybdenum: a metal molybdenum layer may be formed on the base substrate on which the active layer is formed by means of deposition, and then the source-drain metal pattern is formed by a patterning process. The passivation layer may be prepared from $SiO_2$: a silicon dioxide layer may be formed on the base substrate on which the source-drain metal pattern is formed by means of deposition, and then the passivation layer is formed by a patterning process. For example, the patterning process may comprise: photoresist coating, exposure, development, etching and photoresist stripping.

It should be noted that, the gate metal pattern and the source-drain metal pattern may also be made of other material such as aluminum; the gate insulating layer and the passivation layer may also be made of a material such as nitrogen dioxide; and the materials of the respective layer structures in the TFT are not limited in the embodiment of the present disclosure.

For example, the anode may be prepared from indium tin oxide (ITO): a metal layer may be formed by depositing ITO, then the anode is formed by a patterning process; and a preparation material and a preparation method of the anode are not limited in the embodiment of the present disclosure.

For example, the hole injection layer may be prepared from a thermoplastic polymer poly(3,4-ethylenedioxythiophene)/poly(styrenesulfonate) (PEDOT:PSS), and the hole transport layer may be prepared from 1,2,4,5-Tetrakis (trifluoromethyl) Benzene (TFB). The hole injection layer and the hole transport layer may be respectively prepared by an inkjet printing process, and preparation materials and preparation methods of the hole injection layer and the hole transport layer are not limited in the embodiment of the present disclosure.

For example, the light-emitting material layer may be a quantum dot material layer, and the flexible light emitting device is a quantum dot light emitting diodes (QLED) device; alternatively, the light-emitting material layer may also be an organic light-emitting material layer, and the flexible light emitting device is an organic light-emitting diode (OLED) device. The light-emitting material layer may be formed by means of printing, and a preparation material and a preparation method of the light-emitting material layer are not limited in the embodiment of the present disclosure.

For example, the electron transport layer may be prepared from zinc oxide, the electron transport layer may be formed by means of printing or sputtering, the electron injection layer may be formed by means of printing or sputtering; and preparation materials and preparation methods of the electron transport layer and the electron injection layer are not limited in the embodiment of the present disclosure.

For example, the cathode may be prepared from lithium fluoride or aluminum. The cathode may be formed by means of evaporation; and a preparation material and a preparation method of the cathode are not limited in the embodiment of the present disclosure.

Step 205: separating the flexible base substrate from the second surface of the protective film to obtain the flexible display substrate.

It should be noted that, because the protective film is attached to the flexible base substrate by means of electrostatic adsorption, after the flexible base substrate is separated from the second surface of the protective film, neither the flexible base substrate nor the protective film retains a material, for example, a viscous material, that causes contamination to itself, and it is not necessary to clean the flexible base substrate, which simplifies a preparation process of the flexible display substrate. In addition, because the rigid base substrate and the protective film are fixed in snap-fitting by the engaging structures, after the rigid base substrate is separated from the protective film, compared with the related art, the rigid base substrate does not retain any viscous material, so that the rigid base substrate may be reused, which improves a utilization rate of the rigid base substrate, and reduces fabrication costs of the flexible display substrate.

For example, the flexible display substrate may be a QLED display substrate or an OLED display substrate, which is not limited in the embodiment of the present disclosure.

It should be noted that, a sequential order of the steps of the fabrication method of the flexible display substrate provided by the embodiment of the present disclosure may be appropriately adjusted, and the steps may also be correspondingly increased or reduced according to situations. Any skilled in the art, within the technical scope disclosed by the present disclosure, can easily think of varied methods, which should be covered within the protection scope of the embodiment of the present disclosure, and are not repeated here.

In summary, in the fabrication method of the flexible display substrate provided by the embodiment of the present disclosure, the protective film provided with the second engaging structure is attached to the flexible base substrate; by a snap-fitting of the first engaging structure provided on the rigid base substrate and the second engaging structure on the protective film, the flexible base substrate is fixed on the rigid base substrate. Further, the flexible light emitting device is prepared on the surface of the flexible base substrate that is away from the rigid base substrate; and after the flexible light emitting device is prepared, the flexible base substrate is separated from the protective film to obtain the flexible display substrate. In some embodiments of the present disclosure, because the flexible base substrate and the protective film are bonded together in a non-adhesive manner or by means of residue-free glue, it is not necessary to heat in the process of separating the flexible base substrate from the protective film, which can avoid damage to the flexible light emitting device, and further improve fabrication reliability of the flexible display substrate.

Of course, in other embodiments, a first engaging structure of a rigid base substrate may be fixedly connected with a second engaging structure of a protective film firstly, and then a flexible base substrate is fixedly connected with the protective film. An embodiment of the present disclosure provide a fabrication assembly for a flexible display substrate, the assembly comprises a rigid base substrate and a protective film. A first engaging structure is provided on a surface of the rigid base substrate. The protective film comprises a first surface and a second surface opposite to each other, and a second engaging structure is provided on the first surface. The second surface of the protective film is used for attaching to the flexible base substrate; and the rigid base substrate is detachably connected with the protective film by the first engaging structure and the second engaging structure.

For example, where the first engaging structure and the second engaging structure are both tenon-mortise structures, the protective film can be fixed on the rigid base substrate by means of a tenon-mortise connection.

FIG. 3 is a structural schematic diagram of a rigid base substrate provided by an embodiment of the present disclosure. As shown in FIG. 3, a first engaging structure M is provided on a surface of the rigid base substrate 301, and the first engaging structure M comprises a plurality of first bar-shaped tenons m1 and a plurality of first bar-shaped mortises m2.

FIG. 4 is a structural schematic diagram of a protective film provided by an embodiment of the present disclosure. As shown in FIG. 4, a second engaging structure N is provided on the protective film 302, and the second engaging structure N comprises a plurality of second bar-shaped tenons n1 and a plurality of second bar-shaped mortises n2.

With reference to FIG. 3 and FIG. 4, a structure of a first bar-shaped tenon m1 matches a structure of a second bar-shaped mortise n2, and a structure of a second bar-shaped tenon n1 matches a structure of a first bar-shaped mortise m2. For example, a structure of a first bar-shaped tenon matches a structure of a second bar-shaped mortise, that is, a shape and a size of the first bar-shaped tenon both match a shape and a size of the second bar-shaped mortise; and a structure of a second bar-shaped tenon matches a structure of a first bar-shaped mortise, that is, a shape and a size of the second bar-shaped tenon both match a shape and a size of the first bar-shaped mortise.

For example, the rigid base substrate may be prepared from a metal material, glass or a polyvinyl chloride material. The protective film may be prepared from a PET material, a PI material or tempered glass. The materials of the rigid base substrate and the protective film are not limited in the embodiment of the present disclosure.

A first bar-shaped tenon, a first bar-shaped mortise, a second bar-shaped tenon and a second bar-shaped mortise whose longitudinal cross-sections are in rectangular shapes are taken as an example to illustrate reference to FIG. 3 to FIG. 8. In other embodiments, longitudinal cross-sections of a first bar-shaped tenon, a first bar-shaped mortise, a second bar-shaped tenon and a second bar-shaped mortise may be in other shapes, for example, a triangular shape, but the embodiments of the present disclosure are not limited thereto.

Hereinafter, the first bar-shaped tenon, the first bar-shaped mortise, the second bar-shaped tenon and the second bar-shaped mortise whose longitudinal cross-sections are in trapezoidal shapes are taken as an example to illustrate.

Figure 9:
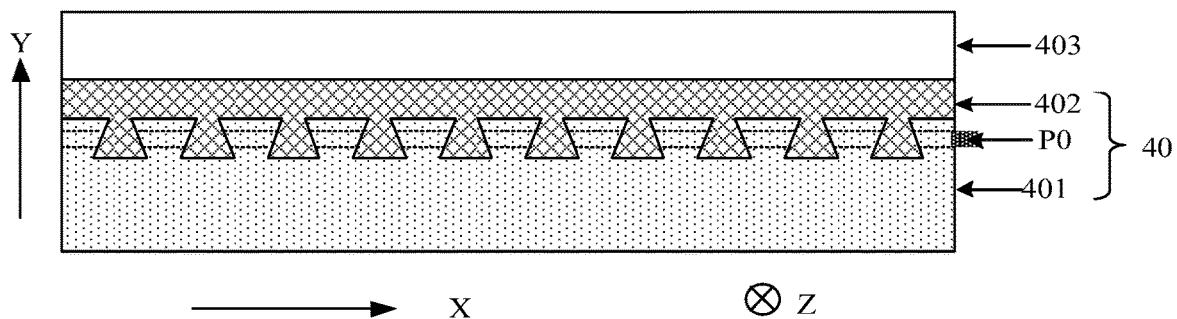
FIG. 9 is a schematic diagram of a fabrication assembly for a flexible display substrate and a flexible base substrate on the assembly provided by another embodiment of the present disclosure.

FIG. 9 is a schematic diagram of a fabrication assembly for a flexible display substrate and a flexible base substrate on the assembly provided by another embodiment of the present disclosure. FIG. 9 illustrates a fabrication assembly 40 of a flexible display substrate and a flexible base substrate 403 on the assembly. As shown in FIG. 9, the fabrication assembly 40 of a flexible display substrate comprises a rigid base substrate 401 and a protective film 402. As shown in FIG. 9, the fabrication assembly 40 of a flexible display substrate further comprises a baffle P0.

Figure 10:
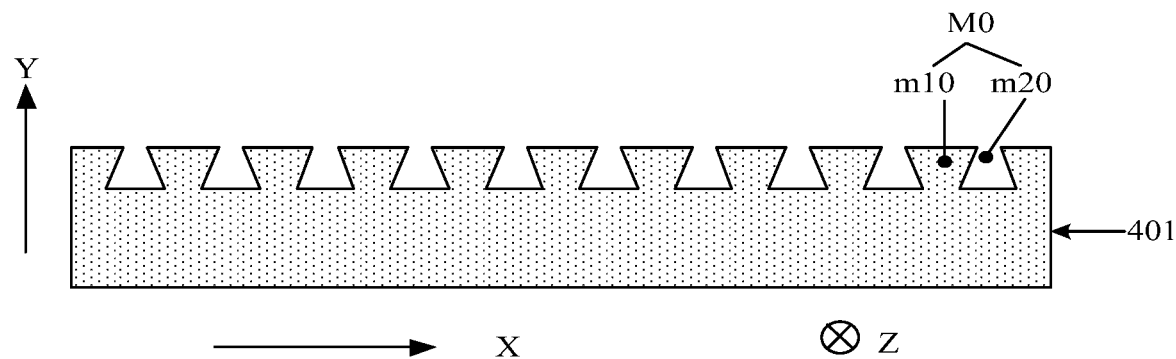
FIG. 10 is a schematic diagram of a rigid base substrate in a fabrication assembly for a flexible display substrate provided by an embodiment of the present disclosure.

FIG. 10 is a schematic diagram of a rigid base substrate in a fabrication assembly for a flexible display substrate provided by an embodiment of the present disclosure. As shown in FIG. 10, the rigid base substrate 401 comprises a first engaging structure MO, and the first engaging structure MO comprises a plurality of first bar-shaped tenons m10 and a plurality of first bar-shaped mortises m20. As shown in FIG. 10, a first bar-shaped mortise m20 is provided between adjacent first bar-shaped tenons m10, and a first bar-shaped tenon m10 is provided between adjacent first bar-shaped mortises m20. As shown in FIG. 10, shapes and sizes of the plurality of first bar-shaped mortises m20 are the same, but the embodiments of the present disclosure are not limited thereto.

Figure 11:
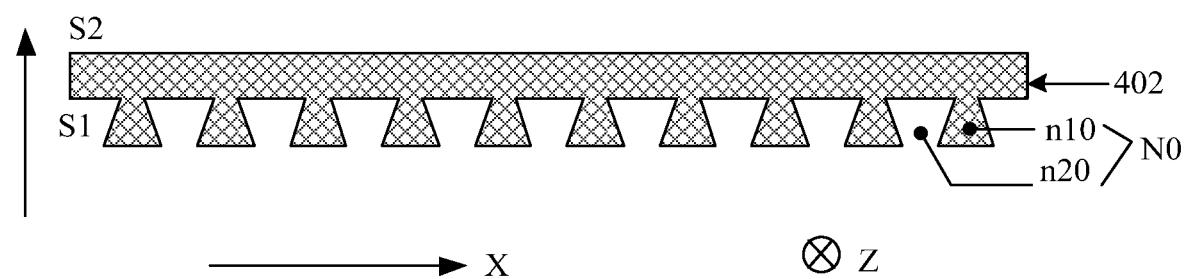
FIG. 11 is a schematic diagram of a protective film in a fabrication assembly for a flexible display substrate provided by an embodiment of the present disclosure.

FIG. 11 is a schematic diagram of a protective film in a fabrication assembly for a flexible display substrate provided by an embodiment of the present disclosure. As shown in FIG. 11, the protective film 402 comprises a first surface S1 and a second surface S2 that are opposite to each other, a second engaging structure NO is provided on the first surface S1, and the second engaging structure NO comprises a plurality of second bar-shaped tenons n10 and a plurality of second bar-shaped mortises n20.

As shown in FIG. 11, there is a second bar-shaped mortise n20 between adjacent second bar-shaped tenons n10. As shown in FIG. 11, there is a second bar-shaped tenon n10 between adjacent second bar-shaped mortises n20. For example, shapes and sizes of the plurality of second bar-shaped tenons n10 are the same, but the embodiments of the present disclosure are not limited thereto.

As shown in FIG. 9 to FIG. 11, longitudinal cross-sections of the first bar-shaped tenon m10, the first bar-shaped mortise m20, the second bar-shaped tenon n10 and the second bar-shaped mortise n20 are in trapezoidal shapes, so that the rigid base substrate 401 and the protective film 402 are fixed in both a first direction X and a second direction Y. Where the longitudinal cross-sections of the first bar-shaped tenon m10, the first bar-shaped mortise m20, the second bar-shaped tenon n10 and the second bar-shaped mortise n20 are in trapezoidal shapes, the rigid base substrate 401 and the protective film 402 can be fixed together in the second direction Y, even if the protective film 402 is not provided with a magnetic material. Of course, in some embodiments of the present disclosure, even if longitudinal cross-sections of a first bar-shaped tenon m10, a first bar-shaped mortise m20, a second bar-shaped tenon n10 and a second bar-shaped mortise n20 are in trapezoidal shapes, a magnetic material may be also provided on a surface of the second bar-shaped tenon n10 and/or the second bar-shaped mortise n20 of the protective film 402.

Figure 12:
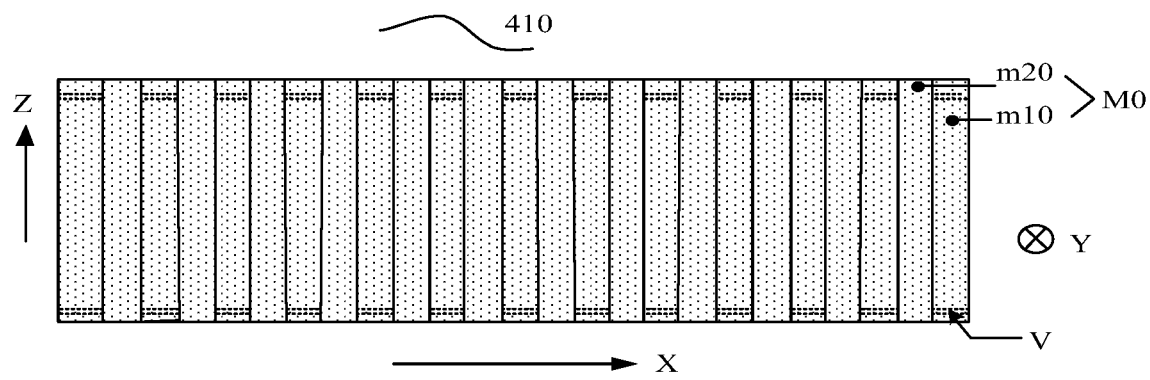
FIG. 12 is a schematic diagram of a rigid base substrate in a fabrication assembly for a flexible display substrate provided by an embodiment of the present disclosure.

FIG. 12 is a schematic diagram of a rigid base substrate in a fabrication assembly for a flexible display substrate provided by an embodiment of the present disclosure. As shown in FIG. 12, each first bar-shaped tenon m10 is provided with through holes V at both ends of the first bar-shaped tenon m10 in an extension direction thereof. As shown in FIG. 12, at one end of the first bar-shaped tenon m10, a plurality of through holes V are located in a same straight line, and the baffle P0 can be used to pass through the plurality of first bar-shaped tenons m10 to function to fix the protective film 402 and the rigid base substrate 401 in a third direction Z.

Figure 13:
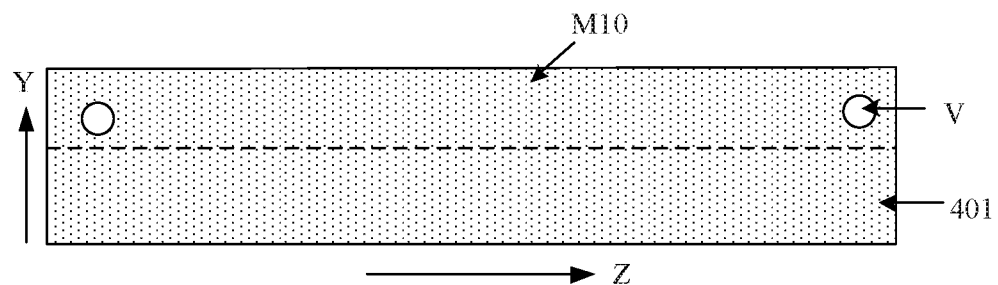
FIG. 13 is a side view of a rigid base substrate in a fabrication assembly for a flexible display substrate provided by an embodiment of the present disclosure.

FIG. 13 is a side view of a rigid base substrate in a fabrication assembly for a flexible display substrate provided by an embodiment of the present disclosure. Two through holes V are respectively provided at both ends of the first bar-shaped tenon m10 in the extension direction thereof. As shown in FIG. 13, each through hole V is surrounded by the material of the first bar-shaped tenon m10. A broken line shown in FIG. 13 is a bottom end of the first bar-shaped mortise m20.

Figure 14:
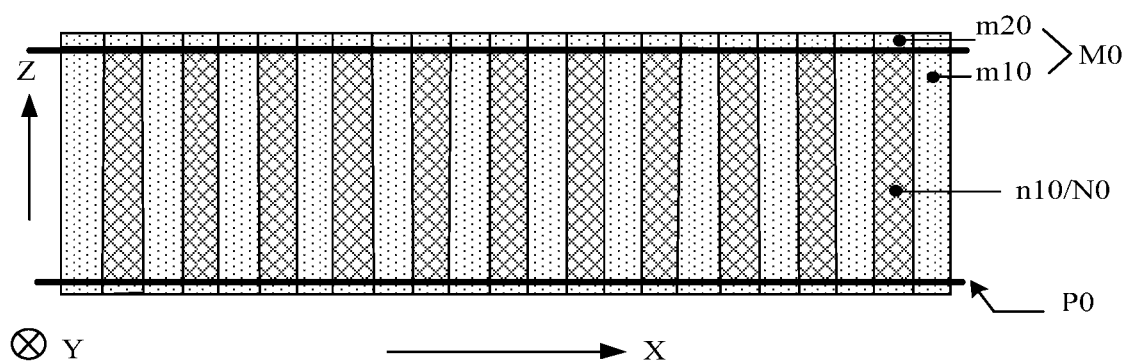
FIG. 14 is a schematic diagram of a baffle in a fabrication assembly for a flexible display substrate provided by an embodiment of the present disclosure.

FIG. 14 is a schematic diagram of a baffle in a fabrication assembly for a flexible display substrate provided by an embodiment of the present disclosure. As shown in FIG. 14, two baffles P0 respectively pass through the through holes V at one end and at the other end of the first bar-shaped tenon m10. FIG. 14 further shows the second bar-shaped tenon n10. As shown in FIG. 14, the second bar-shaped tenon n10 is located between the two baffles P0. Alternatively, the second engaging structure N0 is located between the two baffles P0.

For the sake of clarity, the second bar-shaped mortise n20 is omitted in FIG. 14.

Figure 15:
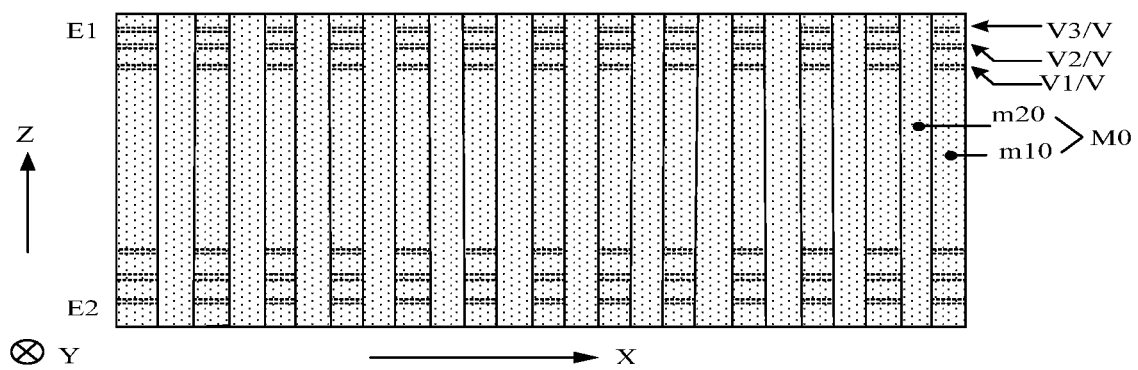
FIG. 15 is a schematic diagram of a rigid base substrate in a fabrication assembly for a flexible display substrate provided by an embodiment of the present disclosure.

FIG. 15 is a schematic diagram of a rigid base substrate in a fabrication assembly for a flexible display substrate provided by an embodiment of the present disclosure. As shown in FIG. 15, a plurality of through holes V are respectively provided at a first end E1 and at a second end E2 of each first bar-shaped tenon m10. In FIG. 15, a case where three through holes: a first through hole V1, a second through hole V2 and a third through hole V3, are respectively provided at the first end E1 and at the second end E2 is taken as an example. The first through holes V1 of the plurality of first bar-shaped tenons m10 are located in a first straight line, the second through holes V2 of the plurality of first bar-shaped tenons m10 are located in a second straight line, and the third through holes V3 of the plurality of first bar-shaped tenons m10 are located in a third straight line. A plurality of through holes are provided at each end, so that the rigid base substrate 401 can be fixedly connected with protective films having different sizes in the third direction Z, and thus, the rigid base substrate can be used for supporting flexible base substrates of different sizes.

For example, as shown in FIG. 15, the first bar-shaped tenons comprise a plurality of through holes V1, V2 and V3 which are sequentially arranged along the extension direction of the first bar-shaped tenon m10.

As shown in FIG. 15, the first bar-shaped tenon m10 and the first bar-shaped mortise m20 both extend in the third direction Z. Correspondingly, the second bar-shaped tenon n10 and the second bar-shaped mortise n20 also extend in the third direction Z. For example, the plurality of first bar-shaped tenons m10 are sequentially arranged along the first direction X, and the plurality of first bar-shaped mortises m20 are sequentially arranged along the first direction X. Accordingly, the plurality of second bar-shaped tenons n10 are also sequentially arranged along the first direction X, and the plurality of second bar-shaped mortise n20 are also sequentially arranged along the first direction X.

Figure 16:
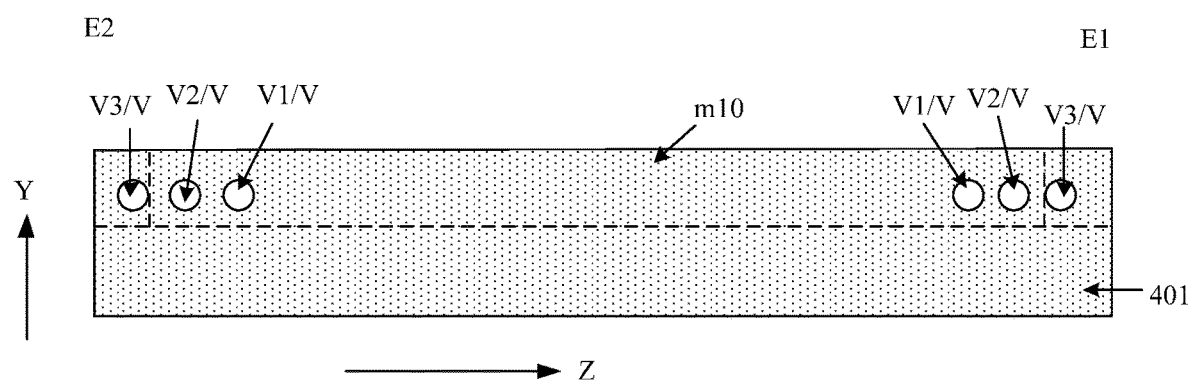
FIG. 16 is a side view of a rigid base substrate in a fabrication assembly for a flexible display substrate provided by an embodiment of the present disclosure.

FIG. 16 is a side view of a rigid base substrate in a fabrication assembly for a flexible display substrate provided by an embodiment of the present disclosure. As shown in FIG. 16, in the third direction Z, a size of a protective film placed between the third through hole V3 of the first end E1 of the first bar-shaped tenon m10 and the third through hole V3 of the second end E2 of the first bar-shaped tenon m10 is the largest. That is, the size of the protective film placed between the through holes V having the farthest distance between the first end E1 and the second end E2 of the first bar-shaped tenon m10 is the largest.

As shown in FIG. 9 to FIG. 16, where the protective film 402 and the rigid base substrate 401 are connected with each other, the protective film 402 may be slid along the extension direction of the first bar-shaped tenon m10 or the first bar-shaped mortise m20, for example, along the third direction Z, so that the rigid base substrate 401 and the protective film 402 are fixed in both the first direction X and the second direction Y and then the baffle P0 is allowed to pass through the through hole V, so that the rigid base substrate 401 and the protective film 402 are fixed in the third direction Z.

For example, except that shapes of the longitudinal cross-sections are different, descriptions of the first bar-shaped tenon m1, the first bar-shaped mortise m2, the second bar-shaped tenon n1 and the second bar-shaped mortise n2 may be referred to respectively for the first bar-shaped tenon m10, the first bar-shaped mortise m20, the second bar-shaped tenon n10 and the second bar-shaped mortise n20, which are not repeated here.

The fabrication assembly for a flexible display substrate and/or the fabrication method of a flexible display substrate provided by the embodiments of the present disclosure can solve the problem in the related art that the flexible light emitting device is easily damaged, because the flexible base substrate and the rigid base substrate are fixedly bonded together through a bonding layer and the rigid base substrate have to be heated when stripped.

The term "and/or" herein is merely an association relationship describing associated objects, and indicates that three relationships may exist, for example, A and/or B may represent: three cases where A exists alone, A and B exist simultaneously, and B exists alone. In addition, the character "/" herein generally indicates an "or" relationship between associated objects.

The above descriptions are only specific embodiments of the present disclosure, but the protection scope of the present disclosure is not limited thereto, those skilled in the art may make some improvements and modifications within the technical scope of the present disclosure, and the improvements and modifications should be within the protection scope of the present disclosure. Therefore, the protection scope of the present disclosure should be determined by the protection scope of the claims.

What is claimed is:

1. A fabrication assembly for a flexible display substrate, comprising:
   a rigid base substrate, comprising a first engaging structure being provided on a surface of the rigid base substrate; and
   a protective film, comprising a first surface and a second surface opposite to each other, and comprising a second engaging structure being provided on the first surface,
   wherein the second surface of the protective film is configured to be attached to a flexible base substrate;
   the rigid base substrate and the protective film are configured to be detachably connected with each other by the first engaging structure and the second engaging structure,
      wherein the first engaging structure comprises a plurality of first bar-shaped tenons and a plurality of first bar-shaped mortises, and the second engaging structure comprises a plurality of second bar-shaped tenons and a plurality of second bar-shaped mortises,
      wherein one of the plurality of first bar-shaped mortises is provided between two adjacent first bar-shaped tenons, and one of the plurality of second bar-shaped mortises is provided between two adjacent second bar-shaped tenons, and
      wherein structures of the plurality of first bar-shaped tenons respectively match structures of the plurality of second bar-shaped mortises, and structures of the plurality of second bar-shaped tenons respectively match structures of the plurality of first bar-shaped mortises; and
   two baffles respectively provided at both ends of at least one first bar-shaped mortise, wherein a height of each of the two baffles is not greater than a height of at least one first bar-shaped tenon.

2. The assembly according to claim 1, wherein the first engaging structure and the second engaging structure are both tenon-mortise structures.

3. The assembly according to claim 1, wherein the first bar-shaped tenon comprises a through hole extending in a direction perpendicular to an extension direction of the first bar-shaped tenon, and the baffles are configured to pass through the through hole.

4. The assembly according to claim 1, wherein the first bar-shaped tenons comprise a plurality of through holes sequentially arranged along the extension direction of the first bar-shaped tenons.

5. The assembly according to claim 1, wherein the second engaging structure satisfies at least one of conditions below:
a surface of each of the plurality of second bar-shaped tenons is provided with a magnetic material; and
an inner wall of each of the plurality of second bar-shaped mortises is provided with a magnetic material.

6. The assembly according to claim 1, wherein a size of each of the plurality of first bar-shaped tenons is equal to a size of each of the plurality of second bar-shaped tenons; and
a size of each of the plurality of second bar-shaped tenons is equal to a size of each of the plurality of first bar-shaped mortises.

7. The assembly according to claim 1, wherein a shape of a longitudinal cross-section of at least one of the first bar-shaped tenons or at least one of the second bar-shaped tenons comprises at least one of a rectangular shape, a triangular shape and a trapezoidal shape.

8. A fabrication method of a flexible display substrate, comprising:
providing a rigid base substrate, a flexible base substrate and a protective film, wherein a first engaging structure is provided on a surface of the rigid base substrate, the protective film comprises a first surface and a second surface opposite to each other, and a second engaging structure is provided on the first surface;
attaching the second surface of the protective film to the flexible base substrate, so as to allow the protective film and the flexible base substrate to be fixed;
snap-fitting the first engaging structure and the second engaging structure, so as to allow the protective film to be fixed on the rigid base substrate;
preparing a light emitting device on a surface of the flexible base substrate that is away from the rigid base substrate; and
separating the flexible base substrate from the second surface of the protective film, to obtain the flexible display substrate.

9. The method according to claim 8, wherein the attaching the second surface of the protective film to the flexible base substrate comprises:
attaching the second surface of the protective film to the flexible base substrate by means of electrostatic adsorption or residue-free glue.

10. The method according to claim 8, wherein the first engaging structure and the second engaging structure are both tenon-mortise structures; and
the snap-fitting the first engaging structure and the second engaging structure, so as to allow the protective film to be fixed on the rigid base substrate, comprises:
fixing the protective film on the rigid base substrate by means of a tenon-mortise connection.

11. The method according to claim 8, wherein the protective film and the rigid base substrate are fixed in a first direction by the first engaging structure and the second engaging structure;
the first engaging structure comprises a plurality of first bar-shaped tenons and a plurality of first bar-shaped mortises, and the second engaging structure comprises a plurality of second bar-shaped tenons and a plurality of second bar-shaped mortises;
one of the plurality of first bar-shaped mortises is provided between two adjacent first bar-shaped tenons, and one of the plurality of second bar-shaped mortises is provided between two adjacent second bar-shaped tenons; and
structures of the plurality of first bar-shaped tenons respectively match structures of the plurality of second bar-shaped mortises, and structures of the plurality of second bar-shaped tenons respectively match structures of the plurality of first bar-shaped mortises.

12. The method according to claim 11, wherein a size of each of the first bar-shaped tenons is equal to a size of each of the second bar-shaped mortises; and a size of each of the second bar-shaped tenons is equal to a size of each of the first bar-shaped mortises.

13. The method according to claim 11, wherein the second engaging structure satisfies at least one of conditions below:
a surface of at least one second bar-shaped tenon is provided with a magnetic material; and
an inner wall of at least one second bar-shaped mortise is provided with a magnetic material;
the protective film and the rigid base substrate are configured to be fixed in a second direction, and the second direction is perpendicular to the first direction.

14. The method according to claim 13, wherein a shape of a longitudinal cross-section of at least one of the first bar-shaped tenons or at least one of the second bar-shaped tenons comprises a trapezoidal shape, so as to allow the protective film and the rigid base substrate to be fixed in the second direction.

15. The method according to claim 13, wherein two baffles are respectively provided at both ends of at least one first bar-shaped mortise, so as to allow the protective film and the rigid base substrate to be fixed in a third direction;
a height of each of the baffles is not greater than a height of the first bar-shaped tenon; and the third direction is perpendicular to a plane in which the first direction and the second direction are located.

16. The method according to claim 15, wherein the first bar-shaped tenon comprises a through hole provided in a direction perpendicular to an extension direction of the first bar-shaped tenon, and the baffles are provided to pass through the through hole, so as to allow the protective film and the rigid base substrate to be fixed in the third direction.

17. The method according to claim 8, wherein the flexible base substrate is separated from the second surface of the protective film by means of hand tearing or a film tearing machine.

18. The method according to claim 8, wherein
the providing the protective film comprises:
providing a film base material; and
forming the second engaging structure on a first surface of the film base material by a patterning process;
alternatively, the providing the protective film comprises:
providing a film base material;
preparing the second engaging structure; and
fixing the second engaging structure on the first surface of the film base material by a bonding agent.

\* \* \* \* \*